United States Patent [19]
Hancock

[11] Patent Number: 5,834,944
[45] Date of Patent: Nov. 10, 1998

[54] SAFETY INTERLOCK SYSTEM FOR A WAFER PROBER TESTING DEVICE

[75] Inventor: Gary Hancock, St. Hedwig, Tex.

[73] Assignee: Sony Corporation, Tokyo, Japan

[21] Appl. No.: 623,207

[22] Filed: Mar. 28, 1996

[51] Int. Cl.$^6$ .................................................. G01R 31/02
[52] U.S. Cl. ........................................ 324/754; 324/158.1
[58] Field of Search .................................... 324/754, 755, 324/756, 761, 158.1; 200/5 A, 61.62, 61.71, 61.72

[56] References Cited

U.S. PATENT DOCUMENTS 5,270,641  12/1993  Van Loan et al. ....................... 324/761
5,404,111   4/1995  Mori et al. ............................... 324/754

*Primary Examiner*—Ernest F. Karlsen
*Attorney, Agent, or Firm*—Harold T. Fujii; Jerry A. Miller

[57] ABSTRACT

A wafer prober testing device uses a test head safety interlock system to prevent inadvertent movement of a test head which is locked to a head plate. The test head is movable between a raised position and a lowered position, and is mounted to the head plate when it is in the lowered position. A test head controller controls the movement of the test head between the raised position and the lowered position. A locking lever, which is mounted to the head plate, is movable between a lock position and an unlock position. The locking lever locks the test head to the head plate when the test head is in the lowered position, to ensure that the testing equipment is accurately aligned and that there are satisfactory electrical contacts, as even a minor misalignment of the testing equipment, or a slight vibration or discontinuity with the probe pads will lead to inaccurate test results. A switch is mounted to the head plate and is actuated by the locking lever, so as to control the supply of power to the test head controller. When the locking lever is in the lock position, power is interrupted to the test head controller, and when the locking lever is in the unlock position, power is supplied to the test head controller so as to enable the test head to be moved between the raised position and the lowered position.

3 Claims, 5 Drawing Sheets

Side of Prober

Side of Prober

SAFETY INTERLOCK SYSTEM FOR A WAFER PROBER TESTING DEVICE

FIELD OF THE INVENTION

This invention relates generally to a safety interlock system and particularly to a safety interlock system for a wafer prober testing device.

BACKGROUND OF THE INVENTION

In semiconductor manufacturing, it is advantageous to test both partially assembled or completely assembled semiconductor devices so as to monitor the manufacturing process and to identify any malfunctioning devices. Various testing equipment for IC manufacture have existed for many years. Such equipment is useful to analyze and test each IC for performance, operation and suitability for packaging. A variety of electrical tests are also performed to ensure the quality of the ICs. For example, various tests, which are performed by the TSK A-PM-90A wafer prober device, which, as used by Sony, now incorporates the invention described herein, include leakage rate, data retention, standby current, continuity, bit count, etc.

A typical wafer prober test device consists of a test head, a test head control switch, a test head manipulator controller card, a head plate, a locking lever and the prober itself.

One shortcoming of a "typical" wafer prober test device described above is that the test head portion of the device continuously has power supplied to the test head control switch, and therefore, may be "lifted" while the locking lever is still in the "lock" position, causing damage to both the equipment and the person operating the test equipment.

Therefore, it is desirable to have a safety interlock system for a wafer prober test device that provides a mechanism that protects both the operator from being hurt, and the device from being damaged, by an inadvertent operator error.

SUMMARY OF THE INVENTION

For the reasons described above, there is a need for testing devices which provide a safety mechanism to prevent damage to both the equipment and the testing device operators. The present invention meets this need by providing a safety interlock switch which interrupts power to the test head control switch until the locking lever is safely moved to the unlock position. The switch is installed "in-line" with a line supplying power to the test head control switch. The modification to the known testing devices does not represent a substantial economic investment, and may be incorporated into most wafer prober testing devices. By incorporating the safety interlock switch, the substantial damage, to both the wafers and the testing device itself, which could result from movement of the test head while in the "locked" position, is prevented.

In a preferred embodiment of the invention, a test head safety interlock system includes a head plate, a test head, a test head control switch, a locking lever and a roller lever switch. The test head is movable between a raised position and a lowered position, and mounts to the head plate when it is in the "in-use" or the lowered position. The test head control switch controls the movement of the test head between the "stand-by" or raised position, and the "in-use" or lowered position. The locking lever is mounted to the head plate and is movable between a locked position and an unlocked position, for locking the test head to the head plate when the test head is in the lowered position. The roller lever switch is mounted to the head plate and is actuated by the locking lever, controls power to the test head control switch.

When the locking lever is in the locked position, power is interrupted to the test head control switch, and when the locking lever is in the unlocked position, power is supplied to the test head control switch so as to enable the test head to be moved between the raised position and the lowered position.

The above and other objects and advantages of the present invention shall be made apparent from the accompanying drawings and the description thereof.

BRIEF DESCRIPTION OF THE DRAWINGS

The accompanying drawings, which are incorporated in and constitute a part of this specification, illustrate embodiments of the invention, and, together with a general description of the invention given above, and the detailed description given below, serve to explain the principles of the invention.

DETAILED DESCRIPTION OF THE PREFERRED EMBODIMENT

Figure 1:
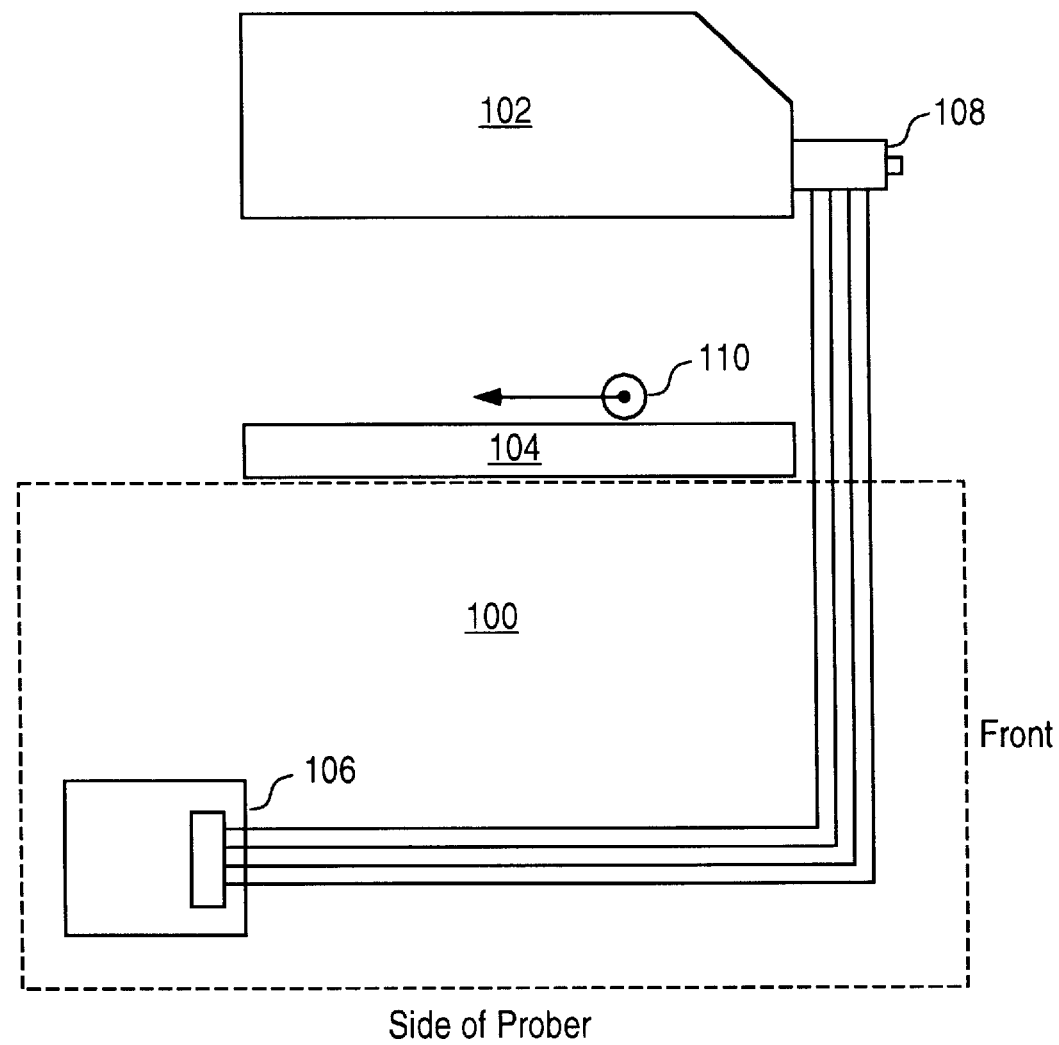
FIG. 1 is a illustration of a known wafer prober device, with the test head shown in the "stand-by" or the "raised" position.
Figure 2:
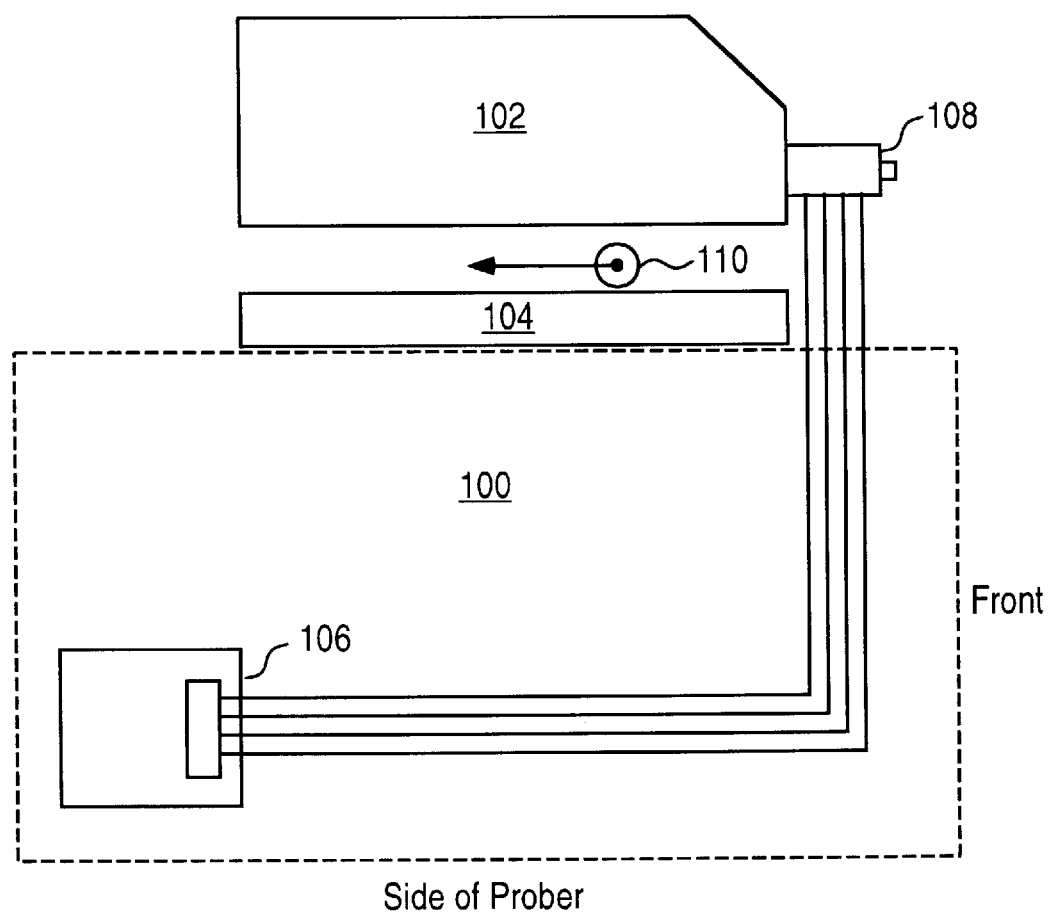
FIG. 2 is an illustration of a known wafer prober device, with the test head shown in the "in-use" or the "lowered" position.

Referring to FIGS. 1 and 2, a known wafer prober device 100 is illustrated (the dashed line has been added to illustrate a base portion of the prober device). In FIG. 1, the test head 102 shown in the "stand-by" or the "raised" position, and in FIG. 2, the test head 102 shown in the "in-use" or the "lowered" position.

A locking lever 110 is a manually-operated lever which is movable between a "lock" position and an "unlock" position. The locking lever 110 ensures that the testing equipment is accurately aligned and that there are satisfactory electrical contacts, as even a minor misalignment of the testing equipment, or a slight vibration or discontinuity with the probe pads will lead to inaccurate test results. When the locking lever 110 is in the "unlock" position, the test head 102 is released from the head plate 104, and may be safely moved between the stand-by and in-use positions. However, when the locking lever 110 is in the "lock" position, the test head 102 and the head plate 104 are joined together in a manner such that the cards inside the test head are interconnected to the head plate and the prober device and the test head cannot safely be moved.

Figure 3:
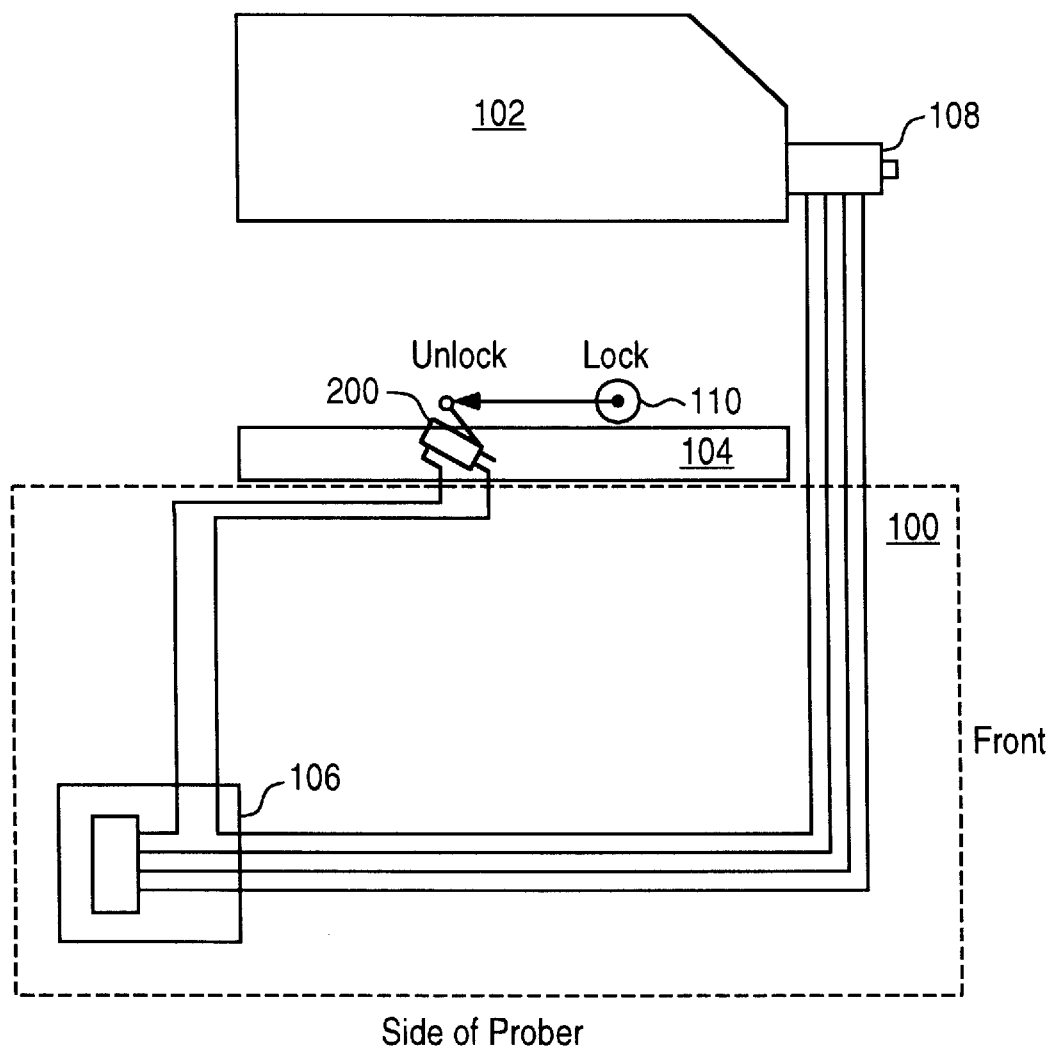
FIG. 3 is an illustration of an embodiment of the invention as applied to a wafer prober device, with the test head shown in the raised position.

FIG. 3 shows an illustration of a preferred embodiment of the present invention as applied to a wafer prober device, with the test head shown in the raised position In FIG. 3, the test head safety interlock system 100 includes test head 102, head plate 104, test head manipulator 106, test head control switch 108, locking lever 110, all shown in FIGS. 1 and 2, and also includes roller lever switch 200.

Figure 4:
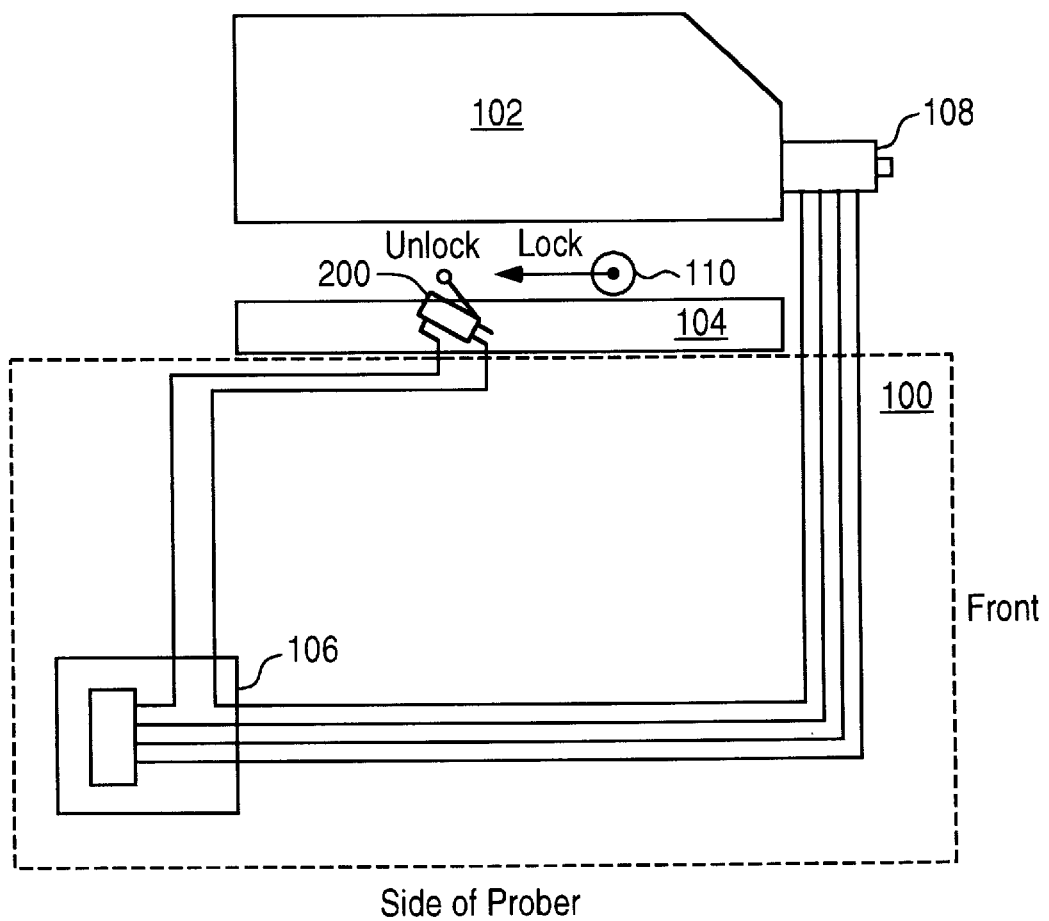
FIG. 4 is an illustration of an embodiment of the invention as applied to a wafer prober device, with the test head shown in the lowered position.

In a preferred embodiment of the invention illustrated in FIGS. 3 and 4, the switch 200 is mounted to the side of head plate 104. A prober, not shown, is located directly beneath the head plate 104. In operation, as explained in detail below, the switch interrupts power to the test head control switch such that the test head cannot be moved until the locking lever is in the unlock position.

The switch 200 is incorporated in such a way so as to render it impossible to move the test head 102 without first releasing the locking lever 110. More particularly, in operation, in FIG. 3, the test head 102 is in the "stand-by" or the "raised" mode. In this mode, the locking lever 110 is in the unlock position. When the locking lever 110 is in the unlock position, it activates switch 200, which then allows power to be supplied to test head control switch 108. Accordingly, since power is supplied to the test head control switch, the test head 102 may be moved from the "standby" to the "in-use" position, as shown in FIG. 4.

In FIG. 4, the test head 102 has been lowered onto the head plate 104. In this mode, the operator moves the locking lever 110 to the lock position, thereby moving the switch 200 to an open state, which cuts off power to the test head control switch. Accordingly, even if an operator inadvertently attempts to lift the test head 102 to the standby position, the test head will not move, as there is no power to cause such movement. The wafer prober device 100 may then conduct testing as required. When the testing has been completed, the locking lever 110 may be moved to the unlock position, thereby activating switch 200 to a closed state, so as to supply power to the test head control switch for movement.

As described in detail above, the safety interlock switch 200 provides both a safety factor for persons operating the test equipment, and, prevents the likelihood of damage to the test equipment and the IC's being tested. In using a known wafer prober test device, an operator may attempt to raise the test head, without first unlocking it—without a safety interlock switch, a test device will continuously supply power to a test head control switch, and therefore, there is no way of preventing an operator from inadvertently raising the test head without first unlocking it, thereby pulling the circuitry in the test head loose. Essentially, the device continues to provide power to the test head control switch, and when it receives an indication to lift the test head from the head plate, it attempts to do so, and pulls the test head out of its connections, doing damage to the circuitry inside the test head and possibly the prober itself.

Figure 5A:
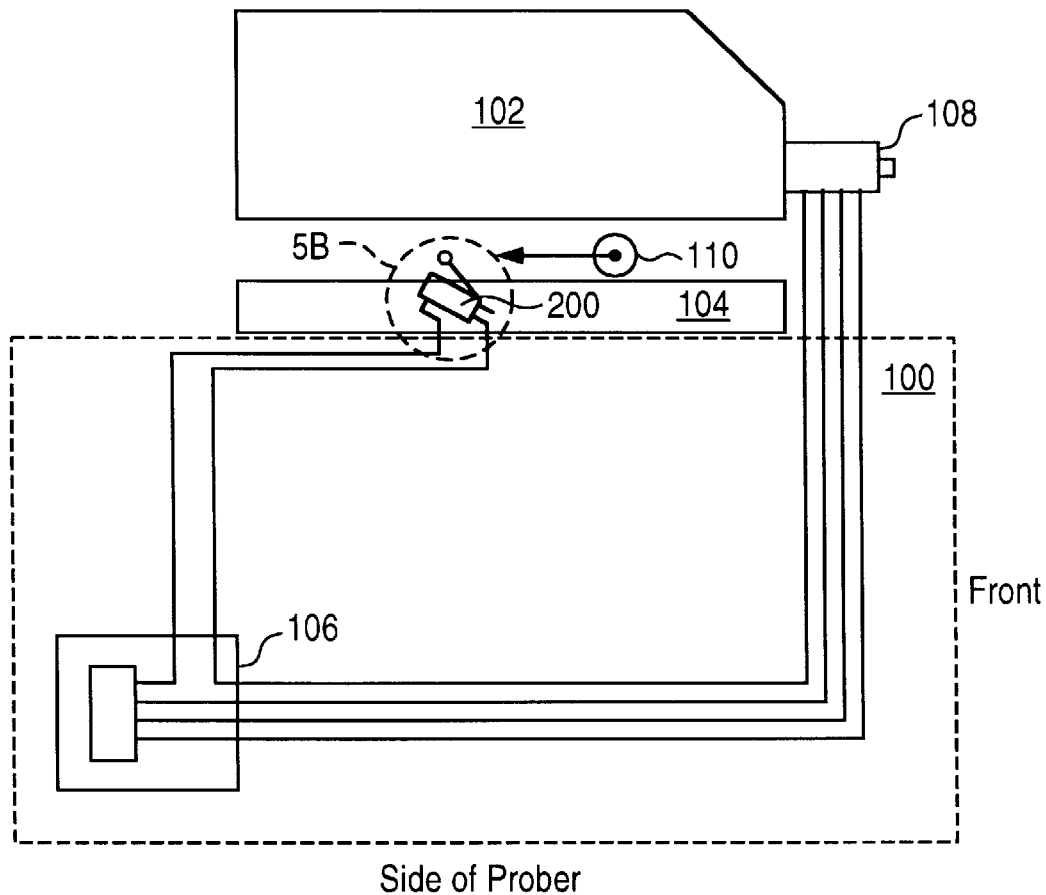
FIG. 5 is a detailed illustration of an embodiment of the invention including an enlarged section illustrating the connection of a roller lever switch to a test head control switch.
Figure 5B:
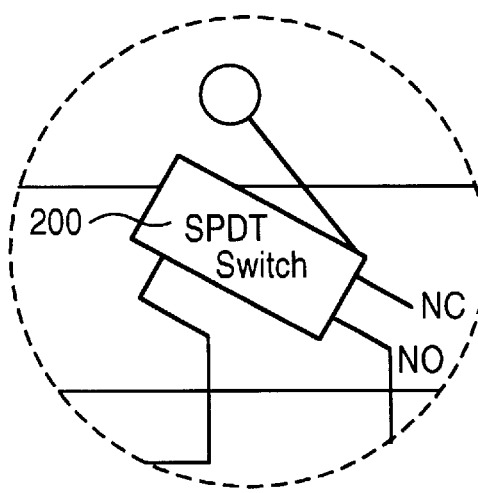

FIG. 5 illustrates in more detail the roller lever switch 200 (it should be noted that roller lever switch 200 need not be an "SPDT switch" as indicated in FIG. 5, but can be any means for interrupting power to the test head control switch until the locking lever 110 is moved to the unlock position.). As shown in FIG. 5, three of the four wires that are connected to the test head control switch 108, are also connected to the test head manipulator control card 106. The roller lever switch 200 interrupts the fourth wire connection, thereby interrupting power to the test head control switch 108. The power supplied, by the line interrupted by the switch 200, provides the test head control switch 108 with the ability to raise and lower the test head 102 from the lowered and raised positions, respectively. Therefore, by inserting the switch 200 in-line, it interrupts power to the test head control switch 108, such that the device cannot provide power or "control" to the test 102 head to be moved until the locking lever 110 is manually moved back to the unlock position, against the switch 200. This enables the power to the control switch 108 so that the operator can again operate the movement of the test head.

While the present invention has been illustrated by a description of a preferred embodiment, and while this embodiment has been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and illustrative example shown and described. Accordingly, departures may be made from such details without departing from the spirit or scope of applicant's general inventive concept.

I claim:

1. A test head safety interlock system comprising:

a head plate;

a test head which is movable between a raised position and a lowered position, wherein said test head mounts to said head plate when said test head is in the lowered position;

test head control means for controlling movement of said test head between the raised position and the lowered position;

locking lever means, mounted to said head plate and movable between a lock position and an unlock position, for locking said test head to said head plate when said test head is in the lowered position; and switch means, mounted to said head plate such that said switch means may be actuated by said locking lever means, for controlling power to said test head control means, wherein when said locking lever means is in the lock position, power is interrupted to said test head control means, and further wherein when said locking lever means is in the unlock position, power is supplied to said test head control means so as to enable said test head to be moved between the raised position and the lowered position.

2. A test head safety interlock system according to claim 1, wherein said switch means is a roller lever SPDT switch.

3. A test head safety interlock system according to claim 2, wherein said switch means is mounted to a side of said head plate.

* * * * *